United States Patent
Nielsen

(10) Patent No.: US 10,353,023 B2
(45) Date of Patent: Jul. 16, 2019

(54) CALCULATING MRI RF COIL SENSITIVITIES USING INTERPOLATION INTO AN ENLARGED FIELD OF VIEW

(71) Applicant: KONINKLIJKE PHILIPS N.V., Eindhoven (NL)

(72) Inventor: Tim Nielsen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 158 days.

(21) Appl. No.: 15/102,288

(22) PCT Filed: Nov. 27, 2014

(86) PCT No.: PCT/EP2014/075735
§ 371 (c)(1),
(2) Date: Jun. 7, 2016

(87) PCT Pub. No.: WO2015/086327
PCT Pub. Date: Jun. 18, 2015

(65) Prior Publication Data
US 2016/0313416 A1    Oct. 27, 2016

(30) Foreign Application Priority Data
Dec. 10, 2013   (EP) .................................... 13196463

(51) Int. Cl.
*G01R 33/24* (2006.01)
*G01R 33/56* (2006.01)
*G01R 33/561* (2006.01)

(52) U.S. Cl.
CPC ....... *G01R 33/246* (2013.01); *G01R 33/5608* (2013.01); *G01R 33/5611* (2013.01)

(58) Field of Classification Search
CPC .......... G01R 33/20; G01V 3/32; A61B 5/055; G01N 24/00

(Continued)

(56) References Cited

U.S. PATENT DOCUMENTS 6,380,741 B1   4/2002  Hajnal et al.
7,309,984 B2  12/2007  Arunachalam et al.
(Continued)

FOREIGN PATENT DOCUMENTS

WO    02086528 A1   10/2002

OTHER PUBLICATIONS

Murakami et al "Intensity Correction of Phased-Array Surface Coil Images" Magnetic Resonance in Medicine vol. 35, No. 4, Apr. 1, 1996 p. 585-590.

(Continued)

*Primary Examiner* — Giovanni Astacio-Oquendo

(57) ABSTRACT

A magnetic resonance imaging (MRI) system (100) has a radio frequency system (114, 116, 120, 124, 126) for acquiring magnetic resonance data (142, 144, 156). The radio frequency system includes a coil (124) with multiple antenna elements (126). The MRI system further includes a processor (133) for controlling the magnetic resonance imaging system. Execution of instructions (140, 170, 172, 174) cause the processor to: acquire (200) calibration magnetic resonance data (142) from a first field of view within the imaging zone using the multiple antenna elements, calculate (202, 300, 302, 304, 400) modified magnetic resonance data (144) by interpolating the calibration magnetic resonance data to a second field of view, calculate (204, 500, 502, 504, 602) a coil sensitivity kernel (146) by deconvolving the modified magnetic resonance data, and calculate (206, 604, 610) a coil sensitivity (148) by transforming each coil sensitivity kernel into image space. The second field of view encompasses and is larger than the first field of view.

17 Claims, 9 Drawing Sheets

(58) Field of Classification Search
USPC .............. 324/307, 311, 300, 200, 301, 309
See application file for complete search history.

(56) References Cited

U.S. PATENT DOCUMENTS

| | | | |
|---|---|---|---|
| 8,184,879 B2 | 5/2012 | Geier et al. | |
| 2010/0237864 A1 | 9/2010 | Stemmer | |
| 2011/0254549 A1 | 10/2011 | Lin | |
| 2014/0139218 A1* | 5/2014 | Findeklee | G01R 33/3628 324/318 |
| 2014/0210472 A1* | 7/2014 | Homann | G01R 33/36 324/309 |
| 2014/0253122 A1* | 9/2014 | Leussler | G01R 33/4215 324/309 |
| 2015/0190659 A1* | 7/2015 | Kohler | A61N 7/02 600/411 |
| 2016/0116559 A1* | 4/2016 | Cohen | G01R 33/561 324/309 |
| 2016/0154080 A1* | 6/2016 | Wiens | G01R 33/56536 324/309 |
| 2016/0202337 A1* | 7/2016 | Muhlsteff | G01R 33/5673 324/309 |
| 2017/0234945 A1* | 8/2017 | Findeklee | G01R 33/288 324/313 |
| 2017/0319097 A1* | 11/2017 | Amthor | A61B 5/055 |

OTHER PUBLICATIONS

Bydder et al "Generalized Smash Imaging" Magnetic Resonance in Medicine vol. 47, p. 160-170 (2002).

Liu et al "Auto-Calibrated Parallel Imaging Reconstruction for Arbitrary Trajectories Using K-Space Sparse Matrices" IEEE Transactions on Medical Imaging vol. 29, No. 3, Mar. 2010 p. 950-959.

Cheng et al "Magnetic Resonance Imaging Image Intensity Correction With Extrapolation and Advanced Smoothing" Magnetic Resonance in Medicine, vol. 55, p. 959-966 (2006).

Gabr et al "Deconvolution-Interpolation Gridding(Ding): Accurate Reconstruction for Arbitrary K-Space Trajectories" Magnetic Resonance in Medicine, vol. 56, p. 1182-1191 (2006).

Uecker et al "Espirit—An Eigenvalue Approach to Autocalibrating Parallel MRI . . . " Magnetic Reson. Med. vol. 71(3) p. 990-1001.

V. Rasche et al "Resampling of Data Between Arbitrary Grids Using Convolution Interpolation" IEEE Transactions on Medical Imaging, vol. 18, No. 5, May 1999 pp. 385-392.

* cited by examiner

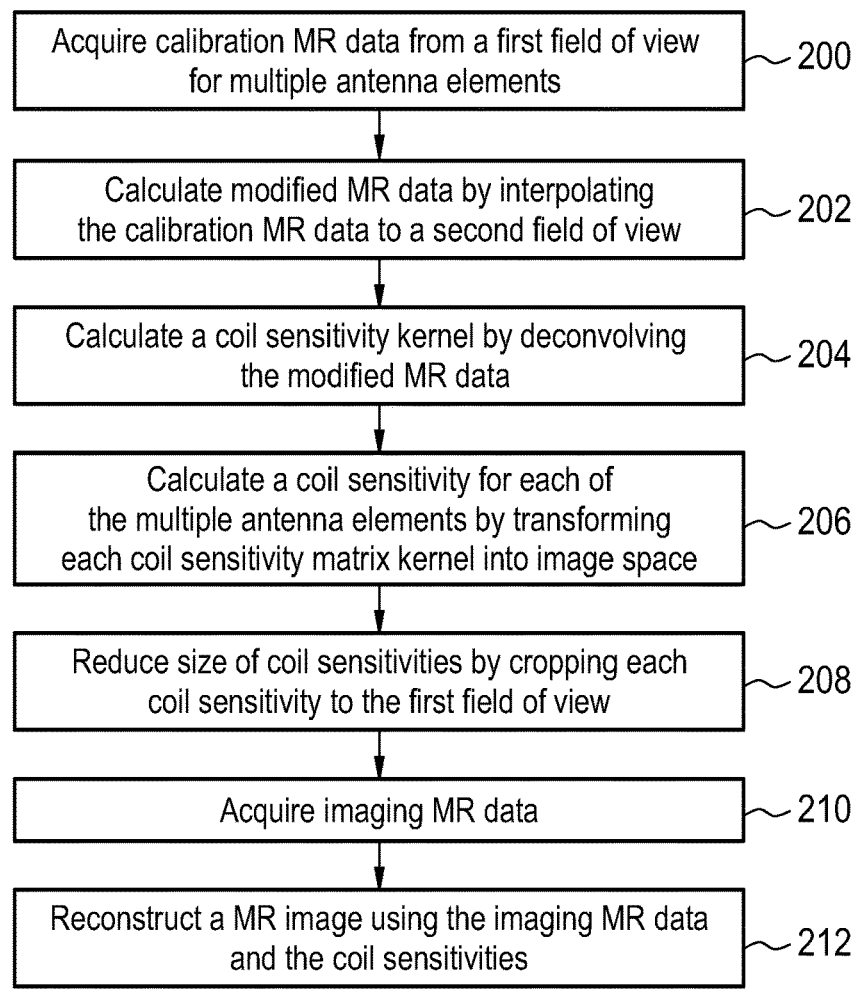
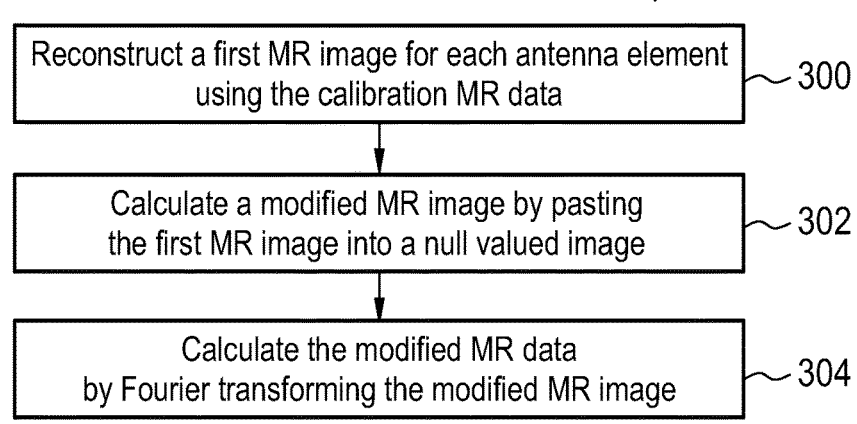

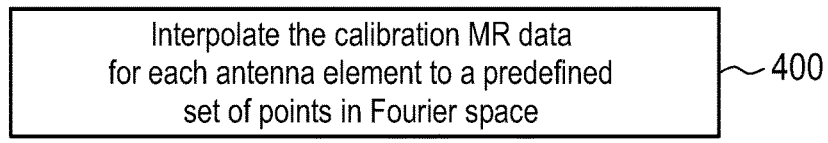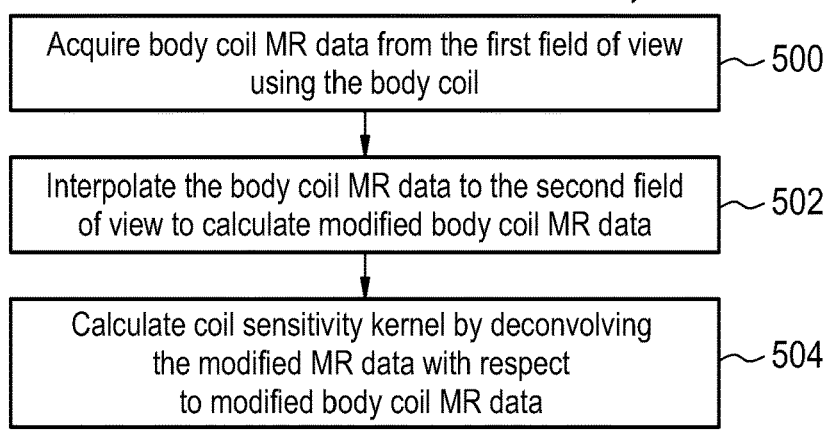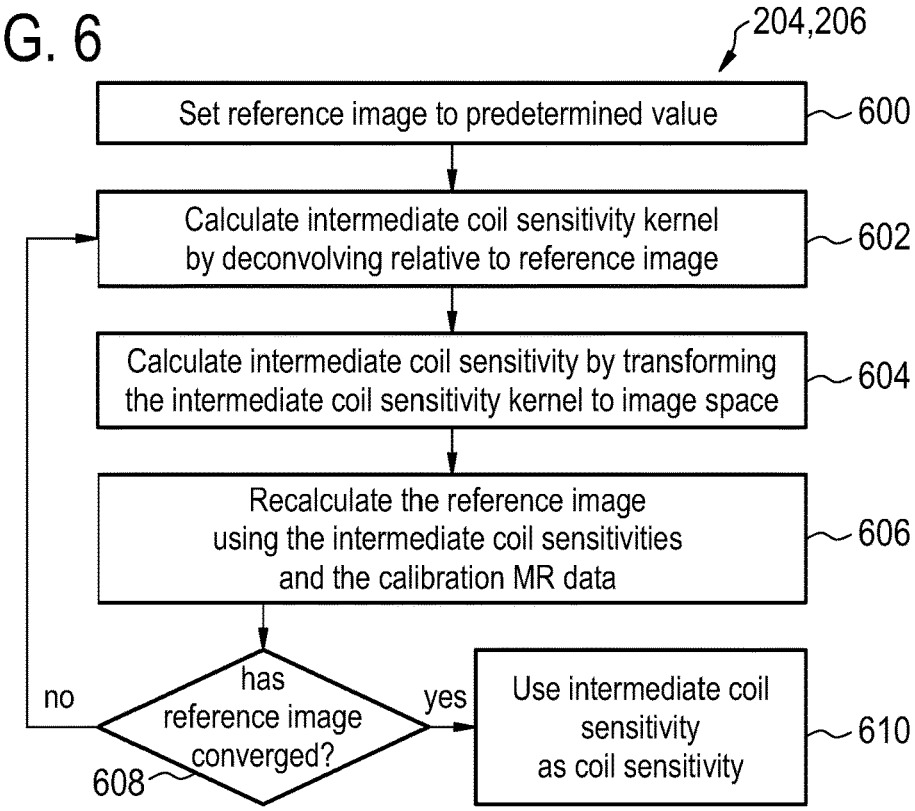

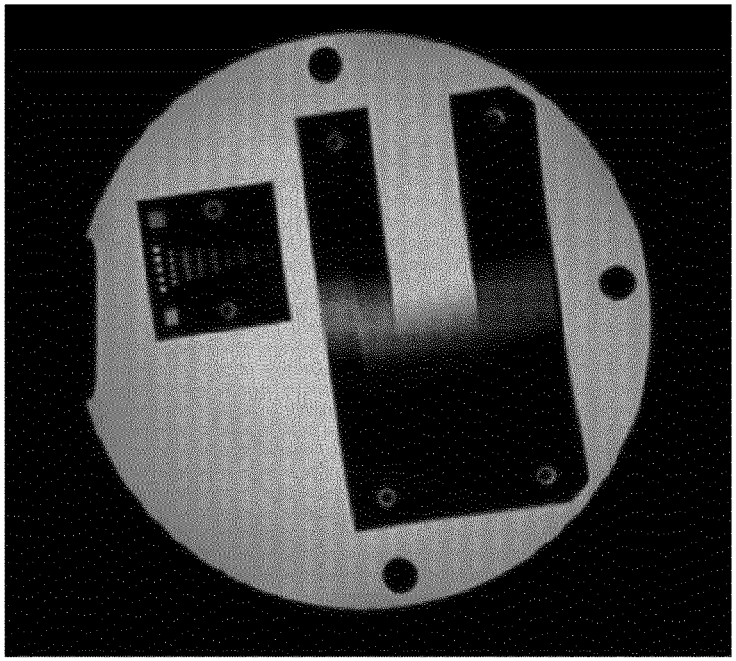
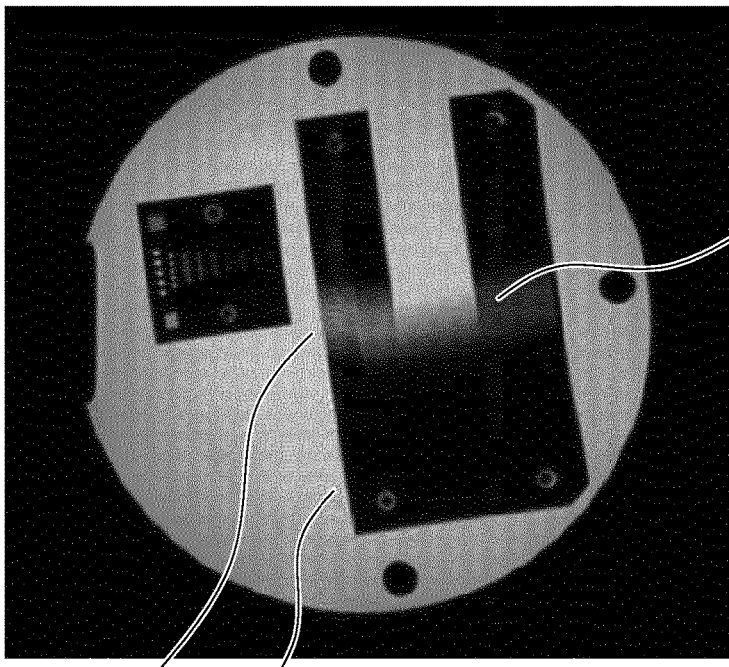
FIG. 13

CALCULATING MRI RF COIL SENSITIVITIES USING INTERPOLATION INTO AN ENLARGED FIELD OF VIEW

CROSS REFERENCE TO RELATED APPLICATIONS

This application is a U.S. national phase application of International Application No. PCT/EP2014/075735, filed on Nov. 27, 2014, which claims the benefit of EP Application Serial No. 13196463.7 filed on Dec. 10, 2013 and is incorporated herein by reference.

TECHNICAL FIELD

The invention relates to parallel magnetic resonance imaging using multiple antenna elements, in particular it relates to methods and apparatuses for calculating the coil sensitivities for the multiple antenna elements.

BACKGROUND OF THE INVENTION

In parallel magnetic resonance imaging, a portion of the k-space being measured is acquired by multiple antenna elements simultaneously. The data acquired by the multiple antenna elements is combined to make a complete magnetic resonance image. Typically sensitive surface coil elements are placed around a subject. The image data collected by each of the multiple antenna elements is combined together using spatially dependent coil sensitivity for each coil element.

Typically the coil sensitivities are determined during a calibration step. One way of calibrating the multiple elements is to acquire data at the same time using a Quadrature Body Coil (QBC) as well as the multiple antenna elements. A QBC is not particularly sensitive; however they acquire data with a good spatial uniformity which can be used to construct a reference image. The coil sensitivity for a particular coil element can be calculated by dividing the image from the coil element by the reference image.

In the journal article Uecker et. al., "ESPIRiT—An Eigenvalue Approach to Autocalibrating Parallel MRI: Where SENSE Meets GRAPPA," Magnetic Resonance in Medicine, online, May 6, 2013 discloses a method of calculating coil sensitivities by a k-space based method to calculate coil sensitivities as Eigen vectors of a linear system.

U.S. Pat. No. 6,380,741 B1 discloses using a pair of r.f. receive coils together with sensitive information concerning those coils to unfurl the aliased images to produce a full image.

SUMMARY OF THE INVENTION

The invention provides for a magnetic resonance imaging system, a method of operating the magnetic resonance imaging system, and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

Magnetic resonance location data as used herein encompasses magnetic resonance data that is acquired for determining the location of a fiducial marker.

In one aspect the invention provides for a magnetic resonance imaging system. The magnetic resonance imaging system comprises a radio-frequency system for acquiring magnetic resonance data of a subject from an imaging zone. The radio-frequency system comprises a coil with multiple antenna elements operable for acquiring the magnetic resonance data. In magnetic resonance imaging technology the antennas used for sending and receiving radio-frequency signals are typically referred to as coils. The multiple antenna elements may be operable for receiving separate radio-frequency transmissions from the subject. The magnetic resonance imaging system further comprises a memory for storing machine-readable instructions. The magnetic resonance imaging system further comprises a processor for controlling the magnetic resonance imaging system.

Execution of the instructions causes the processor to acquire calibration magnetic resonance data from a first field of view within the imaging zone using each of the multiple antenna elements. The calibration magnetic resonance data is data which is used later to calculate the coil sensitivities for each of the multiple antenna elements. Execution of the instructions further cause the processor to calculate modified magnetic resonance data by interpolating the calibration magnetic resonance data to a second field of view within the imaging zone. The second field of view encompasses and is larger than the first field of view. The fields of view may be volumes. In this case the first field of view is a volume within the second field of view. The interpolation of the calibration magnetic resonance data may be accomplished several different ways. It may for instance be done in image space or it may also be done by performing explicit interpolations within k-space.

Execution of the instructions further cause the processor to calculate a coil sensitivity kernel by deconvolving the modified magnetic resonance data for each of the magnetic resonance antenna elements. The signal received or measured at a particular point in k-space by a particular coil I can be considered to be the Fourier transform of the coil sensitivity x the magnetization of the subject in the region being examined. This can be expressed as:

$$s_i = \mathcal{F}(c_i m),$$

where $s_i$ represents the measurements in k-space for coil i, $\mathcal{F}$ is the Fourier transform, $c_i$ is the coil spatially dependent coil sensitivity for coil i, and m is the spatially dependent magnetization in Field of View (FOV).

This equation can be re-written as:

$$s_i = \mathcal{F} c_i * \mathcal{F} m.$$

The quantity $\mathcal{F} c_i$ represents the coil sensitivity kernel, which can be calculated via deconvolution. This is because $s_i$ is measured and $\mathcal{F}$ m can be measured or calculated in an iterative process. Taking the Fourier transform of $\mathcal{F} c_i$ yields the coil sensitivity $c_i$.

In practical terms $\mathcal{F} c_i$ can be chosen to be a kernel of a particular size. For instance a 16×16 block of values (or other block of values) can be chosen and calculated using deconvolution. Once the coil sensitivity kernels are known then the coil sensitivity kernel can be Fourier transformed back into image space and used as a coil sensitivity directly.

In parallel imaging techniques a large number or multiple antenna elements are used to record the same magnetic resonance data at the same time. Each antenna element receives slightly different information and there needs to be a calibration in order to reconstruct the image from all the different antenna elements. This can be accomplished purely through image-based techniques. However, there are disadvantages in using image processing. For instance if there is an air bubble or other region of the subject which does not produce a magnetic resonance or NMR signal then the calibration for this particular region may not be done. This may lead to problems when using the calibrated coil sensitivities to form a parallel imaging technique. This may lead to artifacts or ghosts in the end image. The magnetic resonance imaging system as described above may result in a magnetic resonance imaging system which has greatly reduced artifacts when performing parallel imaging.

Examples may relate to a magnetic resonance imaging method which involves parallel imaging. To unfold aliasing due to under sampling in k-space of the magnetic resonance signals, the coil sensitivity profiles of the RF receiver coils are required. The coil sensitivity profiles are represented by k-space kernels. Normally relatively small kernels (i.e. having a local support in k-space) are employed by virtue of the smooth spatial variations of the coil sensitivity profiles.

The k-space kernel for an individual RF coil may be calculated by deconvolution of the magnetic resonance signals acquired by the loaded (by the object to be imaged) RF coil and k-space reference data. Before the deconvolution is carried out, the field of view is extended to include empty space around the object.

This embodiment may enable better account for the monotonous decay of the coil sensitivity profile from the outline of the object. Notably errors due to not properly taking into account of the object's edge and which could lead to residual unfolding artifacts are avoided. Often extending the field of view by making it twice as large as the existing field of view provides good results.

Accurate coil sensitivity maps (CSMs) are used for parallel MR imaging methods. Embodiments may provide a method to calculate CSMs by a deconvolution in k-space. The proposed method may have the following benefits over known methods:

Requires less data than image based CSM calculation. I.e., it enables fast acquisition of CSM data.

More accurate CSM near edges of the object resulting in less fold-over artifacts. This is also relevant in situations where there are signal voids within the imaged object.

Less susceptible to noisy data.

Orders of magnitude faster than other k-space based methods (e.g. ESPIRiT).

In another embodiment the modified magnetic resonance data is calculated by reconstructing a first magnetic resonance image for each antenna element using the calibration magnetic resonance data. The modified magnetic resonance data is further calculated by calculating a modified magnetic resonance image for each antenna element. Each modified magnetic resonance image is defined by the second field of view and is calculated by pasting the first magnetic resonance image into a null valued image. The first field of view is within the second field of view. Essentially the data from the first magnetic resonance image is copied into the modified magnetic resonance image. Any data in the modified magnetic resonance image that did not come from the first magnetic resonance image is set to null or zero. This may also be described as expanding the field of view and then padding the expanded area with zeros. The modified magnetic resonance data is further calculated by calculating the modified magnetic resonance data by Fourier transforming the modified magnetic resonance image.

This embodiment may be beneficial because it provides an efficient and easy way of interpolating the calibration magnetic resonance data to a second field of view. The coil sensitivity kernels and coil sensitivities calculated using this embodiment result in fewer artifacts.

In another embodiment the modified magnetic resonance data is calculated by interpolating the calibration of the magnetic resonance data for each of the multiple antenna elements to a predefined set of points in Fourier space. The predefined set of points in Fourier space represent the second field of view. The interpolation of points in Fourier space for magnetic resonance imaging is known from the Paper by Rische et. al., "Resampling of Data Between Arbitrary Grids Using Convolution Interpolation, IEEE Trans. on Medical Imaging, Vol. 198, 1999, pp. 385-392. This embodiment also may provide an efficient means of using the effects in magnetic resonance imaging using parallel imaging techniques.

In another embodiment the modified magnetic resonance data for each of the antenna elements comprises a first set of points in Fourier space. The predefined set of points in Fourier space comprises the first set of points in Fourier space. This embodiment may be beneficial because when the predefined set of points are chosen or decided upon the measured points are reused.

In another embodiment execution of the instructions further cause the processor to generate the predetermined set of points in Fourier space by translating a unit cell. A unit cell as used herein encompasses a set of points in Fourier space which may be translated to different positions. In some embodiments the unit cell is the same size as the coil sensitivity kernel. This embodiment may have the advantage that the coil sensitivity kernel may be efficiently calculated.

The grid used to interpolate to is used to calculate the kernel. To be suitable for this task there are two requirements which are beneficial to be fulfilled:
1. The grid must be generated by translating a unit cell (i.e. it must be like a crystal lattice). Cartesian or hexagonal is ok but radial and spiral is not. This requirement is a must because if it is not fulfilled the convolution cannot be written as a linear system of equations using a discrete kernel.
2. The grid must encode a field of view which has sufficient empty space around the object. This requirement is less strict than the one above because you can argue about how much space is sufficient. This depends on the coil geometry and on the targeted level of accuracy of the CSM.

The background of this is that the CSM defined by a k-space kernel is always periodic with the field of view. I.e. the value of the CSM at the left and right edge of the image is the same.
But on the other hand, the sensitivity of typical surface coils has a strong dependency on distance. I.e. the CSM has a high value on one edge of the object and a low value on the opposite edge.

This second requirement ensures that the edges of the object are not too close to the edges of the image because then the true CSM cannot be modeled by a kernel.

It should be possible to estimate how much empty space around the object is required based on the chosen kernel width and dynamic range of the true CSM.

Any grid that fulfills both requirements can be used. It is expected that a grid which shares points with the grid used for data acquisition is beneficial because then the acquired data can be used at the common points without the need for interpolation. If the data is acquired on the correct grid in the first place, you do not need interpolation at all. But this may not be preferred because the acquisition is time consuming and does not add new information. Interpolation in k-space is a more efficient way to generate the values on the grid for a larger field of view (and zero-padding in image space is just a particularly efficient method to interpolate from a given Cartesian grid to a Cartesian grid with finer spacing).

In another embodiment the radio-frequency system further comprises a body coil. Execution of the instructions further cause the processor to acquire body coil magnetic resonance data from the first field of view using the body coil during acquisition of the calibration magnetic resonance data. Execution of the instructions further cause the processor to calculate modified body coil magnetic resonance data by interpolating the body coil magnetic resonance data to the second field of view. For instance this interpolation may be performed using the image-based method that was described above where the body coil magnetic resonance data is reconstructed into an image and then placed into the second field of view and then retransformed back into Fourier space. Alternatively the body coil magnetic resonance data can be interpolated to the predefined set of points in Fourier space. The coil sensitivity kernel for each of the multiple antenna elements is deconvolved with respect to the modified body coil magnetic resonance data. In this embodiment a body coil which while not overly sensitive is useful for acquiring a uniform measurement of the subject. The body coil or quadrature body coil is used to perform and acquire reference data which is then used in the deconvolution process.

In another embodiment execution of the instructions cause the processor to deconvolve the coil sensitivity kernel for each of the multiple antenna elements by initially setting a reference image to a predetermined value. Execution of the instructions cause the processor to further deconvolve the coil sensitivity kernel for each of the multiple antenna elements by iteratively repeating the following steps: the first iterative step is to calculate an intermediate coil sensitivity kernel by deconvolving the modified magnetic resonance data for each of the multiple antenna elements with respect to a Fourier transform of the reference image. The second iterative step is then to calculate an intermediate coil sensitivity for each of the multiple antenna elements by transforming each intermediate coil sensitivity kernel into image space. The third iterative step is to recalculate the reference image using the intermediate coil sensitivities and the calibration magnetic resonance data.

These iterative steps are then repeated a predetermined number of times or until the reference image has converged to within a predetermined statistical measure. For instance if the average change between the reference image and the previously used reference image is less than a predetermined amount then the method may stop. In this method instead of using the measurement from a body coil an image set to a predetermined value is simply used instead. The deconvolution process is performed and then the results are used with the resultant coil sensitivities with the calibration magnetic resonance data to reconstruct a new reference image. The process is then repeated over and over again for a fixed number of cycles or until the image has converged. This embodiment may be beneficial because it eliminates the need of using a body coil. It is also superior to using measurement from a single one of the multiple antenna elements because the multiple antenna elements may not acquire data uniformly from the whole subject.

The iterative method can also be described as follows. The signal $s_i$ of the surface antenna elements is described by the following model:

$$s_i = \hat{c_i m},$$

where the hat denotes the Fourier-transform, m is the magnetization of the object, and $c_i$ is the coil sensitivity. I.e. each surface antenna element senses the same object magnetization weighted according to its own sensitivity profile.

A common assumption is that the QBC has uniform receive sensitivity (QBC=1). In this case, the QBC signal can be used as reference for the coil sensitivities and the above equation can be transformed into:

$$s_i = \mathcal{F} = \hat{c_i} * \hat{m} = \hat{c_i} * s_{QBC}.$$

The value of $c_i$ can be calculated from this equation by e.g. deconvolution if the surface coil signal and the QBC signals are acquired. If the QBC signal is not acquired, a different reference image must be used. In principle the reference image can be chosen arbitrarily. The resulting coil sensitivities will be relative to the chosen reference image. A common choice for the reference image is to use the sum-of-squares (SoS) image $\Sigma_i \hat{s}_i^* \hat{s}_i$, where the star denotes the complex conjugate.

However, this choice of reference image is not optimal if the coil sensitivities are to be represented by small kernels in k-space. This is because the phase of the SoS image is always zero. As a consequence, the phase of the estimated coil sensitivity is directly given by the phase of the surface coil image which may not be smooth enough to be represented by a small kernel. I.e. with this choice of reference image the coil sensitivities resulting from the deconvolution method may have a high error if the kernel size is chosen too small.

Instead of using the SoS image it is better to chose a reference image that has a non-zero phase. One way to a good reference image is to compute it in an iterative procedure.

Initialization: Start with a homogenous reference image: $m_0=1$

Iteration: 1. Calculate $c_{i,k}$ by deconvolution from $s_i = \hat{c}_{i,k} * \hat{m}_k$.
2. Set $m_{k+1} = \Sigma_i c_{i,k} * \hat{s}_i / \Sigma_i c_{i,k} * c_{i,k}$ This iteration converges very quickly to a stable reference image. Typically it can be terminated after 3 iterations. I.e. $m_3$ should be used as reference image instead of the SoS image.

In another embodiment the predetermined value of the reference image is a uniform value. This embodiment may be beneficial because it may not be necessary to know or have an accurate guess of what the subject looks like before starting the iterative method.

In another embodiment the memory further contains pulse sequence data descriptive of a parallel imaging magnetic resonance imaging technique. The pulse sequence data enables the processor to acquire magnetic resonance data using the parallel imaging magnetic resonance technique. In parallel imaging a reduced amount of k-space data is acquired from an array or multiple antenna elements. Some well-known techniques are for example the SENSE technique. Another well-known parallel imaging technique is the so-called GRAPPA technique.

Execution of the instructions further causes the processor to acquire imaging magnetic resonance data using the pulse sequence data to control the magnetic resonance imaging system. In this case the multiple antenna elements are used to acquire the magnetic resonance data. Each of the multiple antenna elements acquires a limited area of the k-space data. Next, execution of the instructions further cause the processor to reconstruct a magnetic resonance image using the imaging magnetic resonance data and the coil sensitivities for each of the multiple antenna elements. This embodiment may be beneficial because it may enable reconstructing the magnetic resonance imaging with fewer artifacts.

In another embodiment execution of the instructions further cause the processor to recalculate the coil sensitivities for each of the multiple antenna elements by cropping its coil sensitivity to the first field of view. This may be beneficial in saving memory space. When performing parallel imaging, coil sensitivities outside of the first field of view will not be used.

In another aspect the invention provides for a method of operating the magnetic resonance imaging system. The magnetic resonance imaging system comprises a radio-frequency system for acquiring magnetic resonance data of a subject from an imaging zone. The radio-frequency system comprises a coil with multiple antenna elements operable for acquiring the magnetic resonance data. The method comprises the step of acquiring calibration magnetic resonance data from a first field of view within the imaging zone using each of the multiple antenna elements. The method further comprises the step of calculating modified magnetic resonance data by interpolating the calibration magnetic resonance data to a second field of view within the imaging zone. The second field of view encompasses and is larger than the first field of view. The method further comprises the step of calculating a coil sensitivity kernel by deconvolving the modified magnetic resonance data for each of the multiple antenna elements. The method further comprises the step of calculating a coil sensitivity for each of the multiple antenna elements by transforming each coil sensitivity matrix kernel into image space.

In another embodiment the modified magnetic resonance data is calculated by reconstructing a first magnetic resonance image for each antenna element using the calibration magnetic resonance data. The modified magnetic resonance data is further calculated by calculating a modified magnetic resonance image for each antenna element. Each modified magnetic resonance image is defined by the second field of view and is calculated by pasting the first magnetic resonance image into a null valued image. The modified magnetic resonance data is further calculated by calculating the modified magnetic resonance data by Fourier transforming the modified magnetic resonance image.

In another aspect the invention provides for a computer program product comprising machine-readable instructions for a processor for controlling a magnetic resonance imaging system. The magnetic resonance imaging system comprises a radio-frequency system for acquiring magnetic resonance data of a subject from an imaging zone. The radio-frequency system comprises a coil with multiple antenna elements operable for acquiring the magnetic resonance data. Execution of the instructions causes the processor to acquire calibration magnetic resonance data from a first field of view within the imaging zone using each of the multiple antenna elements. Execution of the instructions further cause the processor to calculate modified magnetic resonance data by interpolating the calibration magnetic resonance data to a second field of view within the imaging zone. The second field of view encompasses and is larger than the first field of view. Execution of the instructions further causes the processor to calculate a coil sensitivity kernel by deconvolving the modified magnetic resonance data for each of the multiple antenna elements. Execution of the instructions further cause the processor to calculate a coil sensitivity for each of the multiple antenna elements by transforming each coil sensitivity matrix kernel into image space.

In another embodiment the modified magnetic resonance data is calculated by reconstructing a first magnetic resonance image for each antenna element using the calibration magnetic resonance data. The modified magnetic resonance data is further calculated by calculating a modified magnetic resonance image for each antenna element. Each modified magnetic resonance image is defined by the second field of view and is calculated by pasting the first magnetic resonance image into a null valued image. The modified magnetic resonance data is further calculated by calculating the modified magnetic resonance data by Fourier transforming the modified magnetic resonance image.

In another embodiment the modified magnetic resonance data is calculated by interpolating the calibration magnetic resonance data for each of the multiple antenna elements to a predefined set of points in Fourier space. The predefined set of points in Fourier space represents the second field of view.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which:

FIG. 2 illustrates an example of a method of operating the magnetic resonance imaging system of FIG. 1;

FIG. 3 further illustrates a variant of the method illustrated in FIG. 2;

FIG. 4 further illustrates a variant of the method illustrated in FIG. 2;

FIG. 5 further illustrates a variant of the method illustrated in FIG. 2;

FIG. 6 further illustrates a variant of the method illustrated in FIG. 2;

FIG. 13 shows two magnetic resonance images produced using compressed sensing and different CSM calculations.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
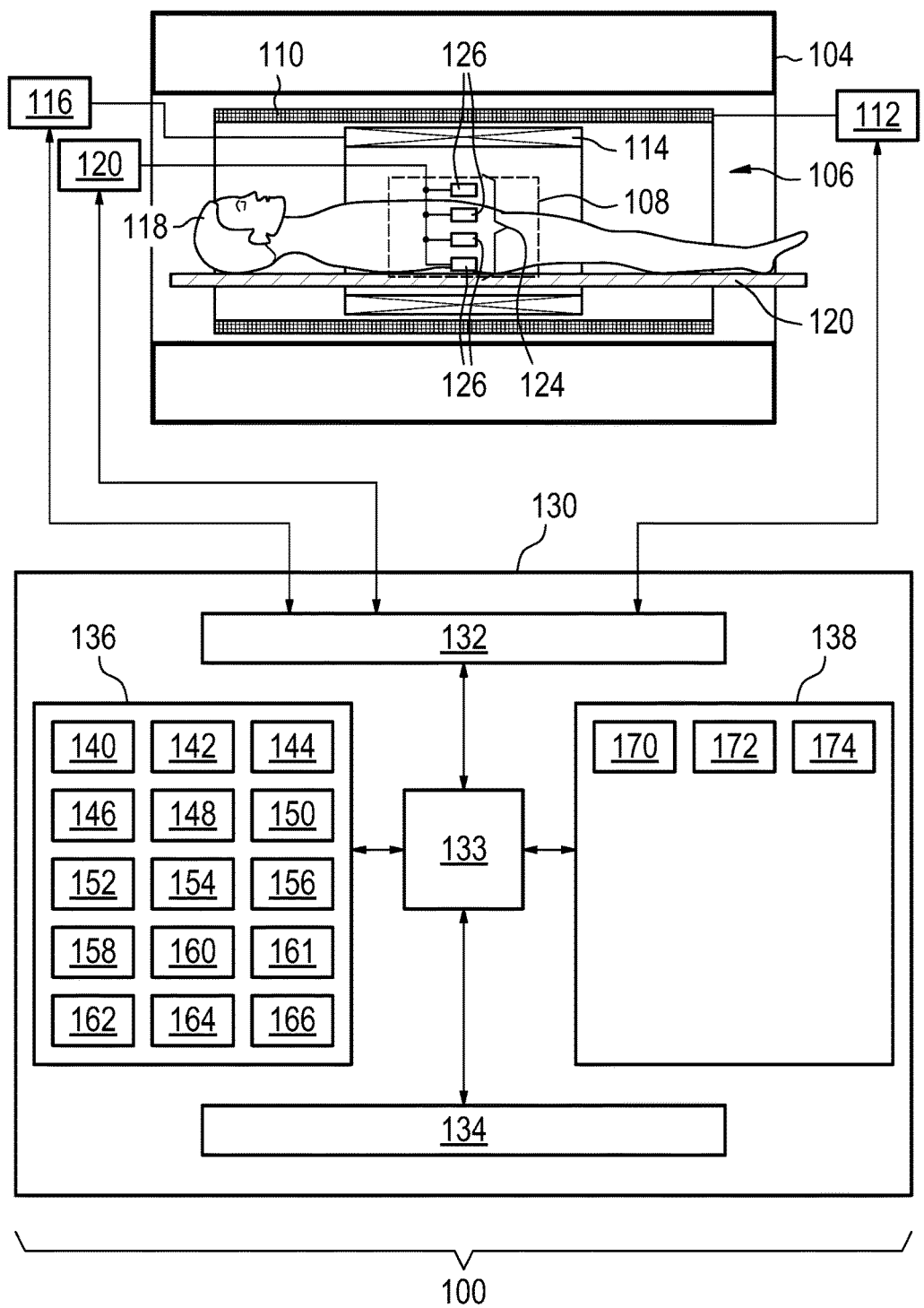
FIG. 1 illustrates an example of a magnetic resonance imaging system.

FIG. 1 shows an example of a magnetic resonance imaging system 100. The magnetic resonance imaging system 100 comprises a magnet 104. The magnet 104 is a superconducting cylindrical type magnet 104 with a bore 106 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Within the bore 106 of the magnet 104 is a body coil 114. The body coil 114 may be a QBC. The body coil 114 is shown as being connected to a transceiver 116. In some embodiments body coil 414 may also be connected to a whole body coil radio frequency amplifier and/or receiver, however this is not shown in this example. If both a transmitter and a receiver 116 are connected to the whole body coil 114, a means for switching between the transmit and receive mode may be provided. For example a circuit with a pin diode may be used to select the transmit or receive mode. A subject support 120 supports a subject 118 within the imaging zone.

A transceiver 122 is shown as being connected to a magnetic resonance imaging coil 124. In this example the magnetic resonance imaging coil 124 is a surface coil comprising multiple antenna elements 126. The transceiver 122 is operable for sending and receiving individual RF signals to the individual antenna elements 126. In this example the transceiver 116 and the transceiver 122 are shown as being separate units. However, in other examples the units 116 and 122 could be combined.

The transceiver 116, the transceiver 122, and the magnetic field gradient coil power supply 112 are shown as being connected to a hardware interface 132 of a computer 130. The computer 130 is further shown as containing a processor 133 which is operable for executing the machine-readable instructions. The computer 130 is further shown as comprising a user interface 134, computer storage 136 and computer memory 138 which are all accessible and connected to the processor 133.

The computer storage 136 is shown as containing one of more pulse sequences 140. The pulse sequences 140 are either instructions or data which can be converted into instructions which enable the processor 133 to acquire magnetic resonance data using the magnetic resonance imaging system 100. The computer storage is further shown as containing calibration magnetic resonance data 142 that was acquired by the antenna elements 126. The computer storage is further shown as containing modified magnetic resonance data 144. The modified magnetic resonance data 144 was created by interpolating the calibration magnetic resonance data 142. This may be performed using several different techniques. It may be done with an image-based method or directly through interpolation in k-space.

The computer storage 136 is further shown as containing a set of coil sensitivity kernels 146 that were calculated using at least the modified magnetic resonance data 144. The coil sensitivity kernels 146 may be calculated in a variety of different ways also. They for instance may be calculated by using an image from a body coil or by iteratively calculating a reference image.

The computer storage 136 is further shown as containing a set of coil sensitivities 148 that were calculated from the coil sensitivity kernels 146. The computer storage is further shown as containing a first magnetic resonance image that was calculated for each antenna element 26 using the calibration magnetic resonance data 142. The computer storage 152 is further shown as containing a modified magnetic resonance image also for each antenna element 126. The modified magnetic resonance image is an image that is padded with zeros and then the first magnetic resonance image is placed into it in the appropriate or correct location. In some examples the first magnetic resonance image 150 and the modified magnetic resonance image 152 are not present. In other examples the modified magnetic resonance image 152 is transformed back into Fourier space to provide the modified magnetic resonance data 144.

The computer storage is further showing a set of points in Fourier space 154 which are used as points for interpolation. Element 154 is not present in all examples. However, in some examples these sets of points in Fourier space 154 are used as the locations where the calibration magnetic resonance data 142 is directly interpolated to the modified magnetic resonance data 144.

In some examples the body coil 114 is not present. In other examples the body coil 114 is used to acquire body coil magnetic resonance data 156. The body coil magnetic resonance data 156 is magnetic resonance data that has been acquired with the body coil. The computer storage 136 is shown as containing modified body coil magnetic resonance data 158. In some examples the modified body coil magnetic resonance data 158 is used with the modified magnetic resonance data 144 to calculate the coil sensitivity kernels 146. In other examples an iterative approach is used.

If an iterative approach is used then the computer storage 136 shows a reference image 160. In some instances the reference image 160 and the intermediate coil sensitivity 162 are used in an iterative approach which will be described below. The computer storage 136 is also optionally shown as containing imaging magnetic resonance data 164 and a diagnostic magnetic resonance image 166. The imaging magnetic resonance data 164 may be acquired using a parallel imaging magnetic resonance technique. The set of coil sensitivities 148 are then used to reconstruct the diagnostic magnetic resonance image 166 using the imaging magnetic resonance data 164.

The computer memory 138 is shown as being a control module 170. The control module 170 contains computer-executable code or instructions which enable the processor 133 to control the operation and function of the magnetic resonance imaging system. For instance the control module 170 may work in conjunction with the pulse sequences 140 to acquire the various magnetic resonance data. The computer memory 138 is shown as further containing an imaging reconstruction Fourier transform module 172 and a k-space interpolation module 174. These two modules 172, 174 contain computer-executable code which enable the processor 133 to perform one or more of the methods shown in FIGS. 2 to 6.

FIG. 2 shows a flowchart which illustrates a method of operating the magnetic resonance imaging system 100 shown in FIG. 1. First in step 200 calibration magnetic resonance data 142 is acquired from a first field of view for multiple antenna elements 126. Next in step 202 modified magnetic resonance data 144 is calculated by interpolating the calibration magnetic resonance data to a second field of view. Next in step 204 a coil sensitivity kernel 146 is calculated 204 by deconvolving the modified magnetic resonance data 144. Next in step 206 a coil sensitivity 148 is calculated for each of the multiple antenna elements by transforming each coil sensitivity matrix into image space. Next in step 208 the size of the coil sensitivities is optionally reduced by cropping each coil sensitivity to the first field of view. Next in step 210 magnetic resonance data 64 is optionally acquired. In step 212 a diagnostic magnetic resonance image 166 is optionally reconstructed using the imaging magnetic resonance data 164 and the set of coil sensitivities 148. Steps 210 and 212 are a parallel imaging technique that uses the determined set of coil sensitivities 148.

FIG. 3 shows a flowchart which explains one way in which step 202 of FIG. 2 could be performed. That is to say FIG. 3 shows a flowchart which illustrates a method of calculating modified magnetic resonance data by interpolating the calibration magnetic resonance data to a second field of view. First in step 300 a first magnetic resonance image 150 is reconstructed for each antenna element using the calibration magnetic resonance data 142. Next in step 302 a modified magnetic resonance image 152 is calculated by pasting the first magnetic resonance image 150 into a null valued image. Finally in step 304, the modified magnetic resonance data 144 is calculated by Fourier transforming the modified magnetic resonance image 152 into Fourier space.

FIG. 4 shows an alternative way of performing step 202 of FIG. 2. FIG. 4 is an alternative way of calculating modified magnetic resonance data 144 by interpolating the calibration magnetic resonance data 142 to a second field of view. In FIG. 400 there is one step labeled 400. Step 400 is to interpolate the calibration magnetic resonance data 142 to the modified magnetic resonance data 144 directly in k-space using the set of predefined points 154.

FIG. 5 shows one way of performing step 204 of FIG. 2. FIG. 5 illustrates one way of calculating a coil sensitivity kernel 146 by deconvolving the modified magnetic resonance data 144. First in step 500 body coil magnetic resonance data 156 is acquired from the first field of view using the body coil 114. Next in step 502 the body coil magnetic resonance data is interpolated to the second field of view to calculate the modified body coil magnetic resonance data 158. This interpolation may be performed in a manner analogous to that shown in FIG. 3 or 4 that was used for the calibration magnetic resonance data. Finally step 504 shows to calculate the coil sensitivity kernel 146 by deconvolving the modified magnetic resonance data 144 with respect to the modified body coil magnetic resonance data 158.

FIG. 6 shows an iterative method of performing steps 204 and 206 of FIG. 2. FIG. 6 shows an iterative method of calculating a coil sensitivity kernel 146 by deconvolving the modified magnetic resonance data 144. First in step 600 a reference image is set to a predetermined value. The reference image is a predetermined image with the second field of view. Next in step 602 an intermediate coil sensitivity kernel 161 is calculated by deconvolving relative to the reference image 160. Next in step 604 an intermediate coil sensitivity 162 is calculated by transforming the intermediate coil sensitivity kernel 161 to image space. In step 606 the reference image 160 is recalculated using the intermediate coil sensitivities 162 and the calibration magnetic resonance data 142. Steps 602, 604 and 606 are performed iteratively where the method is repeated with the new reference image 160. These three steps may be performed a predetermined number of times or the new reference image may be compared to the reference image of the previous iteration to see if the answer has converged to within a statistical measure. This is represented in box 608 which is a decision box with the question has reference image converged, if no then the loop repeats back to step 602. If it has then step 610 is performed and the intermediate coil sensitivity is used as the coil sensitivity.

Accurate coil sensitivity maps (CSMs) are beneficial for parallel MR imaging methods. Examples described herein may provide a method to calculate CSMs by a deconvolution in k-space. The proposed method may have one or more of the following benefits over known methods:

Requires less data than image based CSM calculation. I.e., it enables fast acquisition of CSM data.

More accurate CSM near edges of the object resulting in less fold-over artifacts. This is also relevant in situations where there are signal voids within the imaged object.

Less susceptible to noisy data.

Orders of magnitude faster than other k-space based methods (e.g. ESPIRiT).

Coil sensitivity maps (CSMs) describe the spatial dependency of receive sensitivity (phase and amplitude) of MRI receive coils. Accurate knowledge of the CSMs is required for parallel MR imaging methods to combine the signal of different receive coils into one image and to enable accelerated MR imaging.

Currently, CSMs are calculated in image space by acquiring low resolution images with each receive coil and dividing these images by a common reference image (e.g. body coil or sum-of-squares image).

An alternative to the image based CSM calculation could be ESPIRiT, a k-space based method to calculate CSM as eigenvectors of a linear system, which is currently only used in research applications. However, this method is orders of magnitude slower than the image based method (several minutes calculation time for a 2D CSM), which makes it unsuitable for routine use.

One problem of calculating the CSM by division of two low resolution images is that this approach has inherent systematic errors. These errors are largest at edges of the imaged object. These systematic errors can result in back-folding artifacts.

A second problem with the current approach is that it only leads to a meaningful result in regions where the MR signal strength is sufficient. Outside this region the quality of the CSM degrades rapidly. This can cause problems if there are signal voids within the imaged object, especially when iterative reconstruction algorithms, e.g. compressed sensing, are used.

The image based CSM calculation requires a certain spatial resolution and also requires high signal to noise ratio to give valid results. Consequently, a considerable time is required to acquire the CSM data.

Similar to ESPIRiT, the proposed method avoids the first two problems by calculating the CSM in k-space. But it can be executed orders of magnitude faster than ESPIRiT, resulting in a computation time similar to the image based calculation.

In addition, the proposed method requires less data than the image based method, allowing to reduce the acquisition time.

In examples, the CSM for each receive coil is represented by a small kernel in k-space. The kernel is calculated for each channel by deconvolution of the coil and the reference data in k-space. One step for the proposed method is that before the deconvolution is carried out, the field of view is extended in such a way that there is sufficient empty space around the object.

Below is a detailed list comprising steps of a method to calculate CSMs:

1. Acquire receive coil data and reference data. This is the same as in the current approach to obtain CSMs (with the additional option of acquiring less data than currently).
2. Transform to image space. Simple Fourier-Transform.
3. Extend field of view (Zero padding in image space).

Extending the field of view by zero padding is in principle a trivial operation. However, the necessity for it may be not obvious: The CSMs are to be represented by small kernels in k-space. This is motivated by the smooth spatial variation of the CSM. However, the CSM are monotonously decaying with increasing distance to the coil. I.e. in general the CSM will have a high value at one edge of the object and a low value at the opposite edge of the object. If the object fills the field of view, which is a typically the case in the phase-encoding direction, a discrete representation of the CSM in k-space is not possible by low frequency components alone, because discrete Fourier-transforms represent cyclic functions and the strong jump which occurs at the wrap-around at the image boundary contains large high frequency components.

Extending the field of view by zero filling introduces an area into the coil and reference images from which no information about the coil sensitivity can be obtained. I.e. arbitrary fluctuations of the CSM in this region are not in contradiction to the data. If the field of view extension is sufficiently large (e.g. a factor of 2), it enables connecting the high and low sensitivity regions using only low frequency components. Thus the CSM can then be represented by a small kernel.

4. Transform extended coil and reference images to k-space. Simple Fourier-Transform.
5. Calculate CSM kernel by deconvolution in k-space (using the extended data). Inversion of a small linear system (similar to GRAPPA kernel calculation).
6. Transform kernel to image space. Simple Fourier-Transform.
7. Reduce CSM to original field of view. Simple truncation.

These steps are applied individually to each receive channel. I.e., the data of different receive channels are not mixed as e.g. in ESPIRiT or GRAPPA. As a result, the equation system that needs to be inverted in step 5 is small, enabling a fast calculation.

Figure 7:
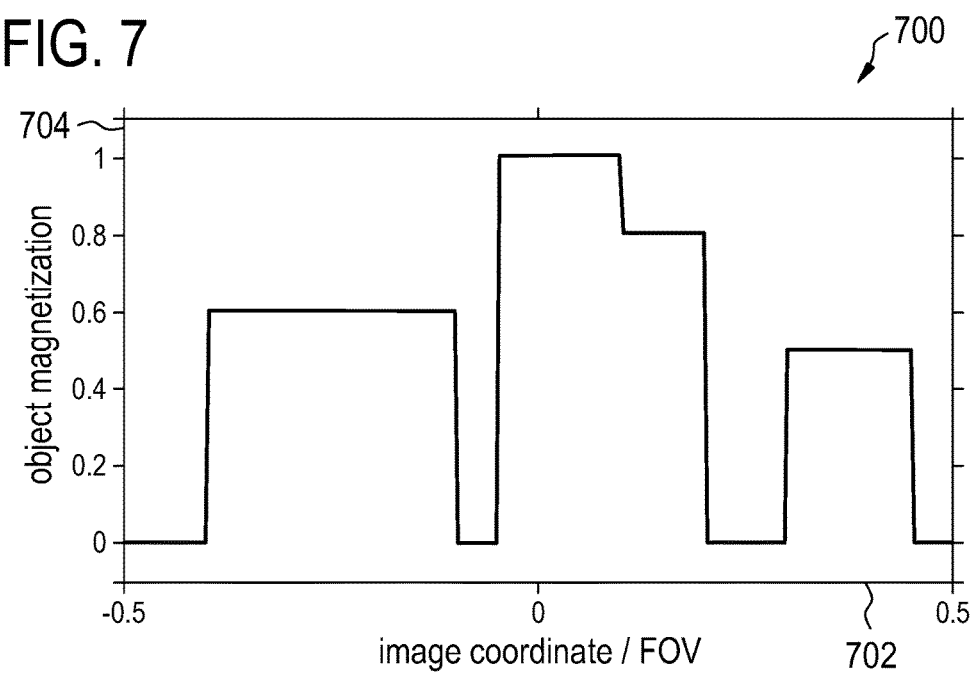
FIG. 7 shows a plot of the magnetization for a one-dimensional object.

FIG. 7 shows an example of a one-dimensional object which is mathematically used to show the advantage of using the examples of methods described herein. The axis labeled 702 may be spatial coordinates and the axis labeled 704 is the object magnetization. It can be seen that there are several regions with zero magnetization.

Figure 8:
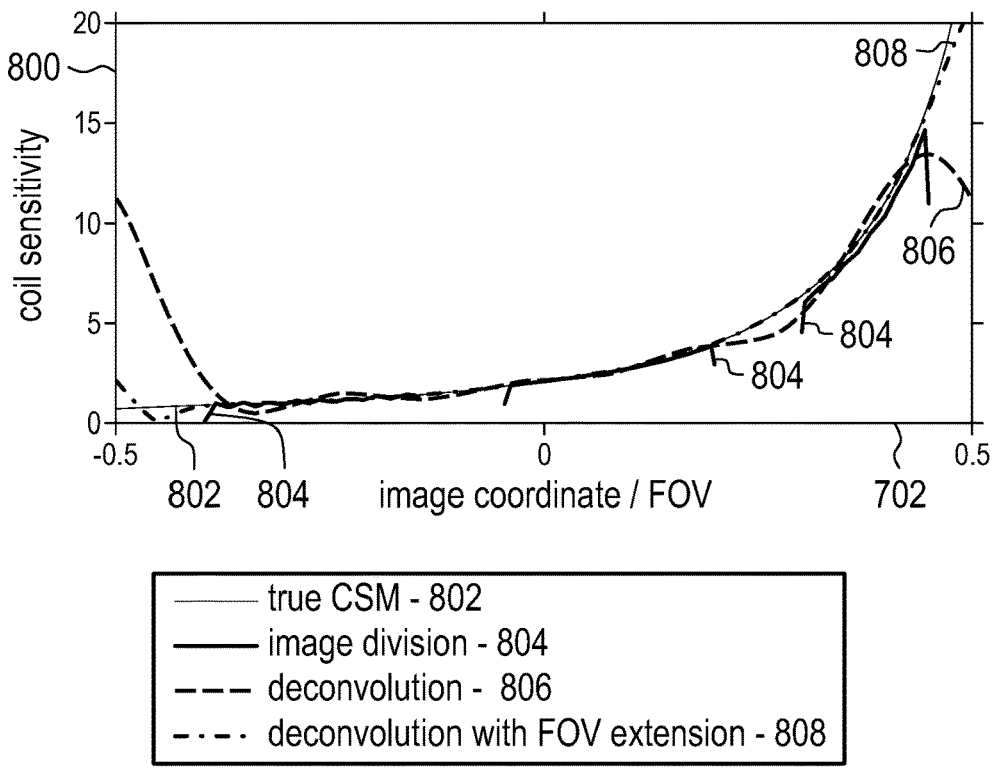
FIG. 8 shows a plot of the calculated CSM using several different methods for the data in FIG. 7.

FIG. 8 shows the coil sensitivity 800 as a function of position 702 in several different methods. The solid line labeled 802 is the true coil sensitivity. The solid line 804 shows the coil sensitivity calculated using image division 804. The dashed line shows the coil sensitivity using only deconvolution 806. The dashed-dot line 808 shows deconvolution with the field of view extensions or equivalently the interpolation in k-space from the first to the second field of view. It can be seen that the deconvolution of the field of view extensions 808 reproduces the true coil sensitivity 802 much better than any of the others.

Figure 9:
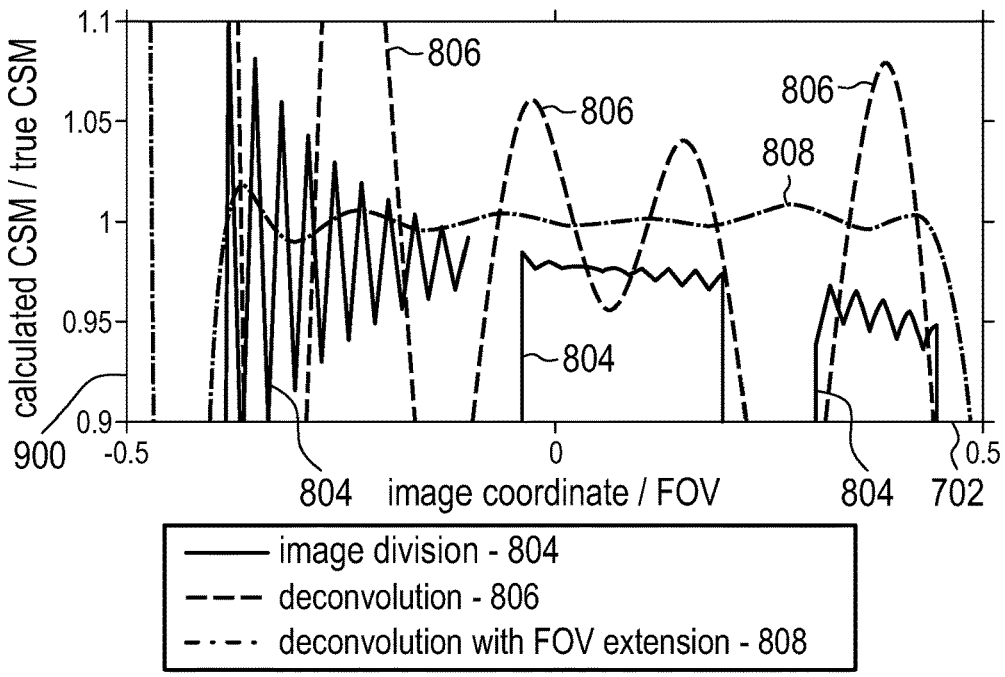
FIG. 9 shows a plot comparing the calculated CSMs of FIG. 8.

The errors of the calculated coil sensitivity with respect to the true coil sensitivity 802 are shown in FIG. 9. The spatial coordinates are axis 702 and the value of the calculated coil sensitivity divided by the true coil sensitivity is shown in axis labeled 900. Again the version using image division is labeled 804, deconvolution is labeled 806 and the dashed-dot line is the deconvolution with the field of view extension 808. It can be seen that the deconvolution with field of view extension 808 is the most accurate.

FIGS. 7, 8, and 9 show a comparison of CSMs calculated from simulated, one-dimensional data with FIG. 7 image division, FIG. 8 deconvolution without field of view extension and FIG. 9 the method comprising deconvolution with field of view extension.

FIG. 7 shows the assumed magnetization of the object, i.e. this graph shows the signal strength that would be measured with a homogeneous coil. It also shows that the object almost fills the field of view and contains two signal voids.

FIG. 8 shows the values of the calculated coil sensitivities, and the bottom graph shows the ratio of the calculated CSM and the true CSM that was used in the simulation.

FIG. 9 demonstrates that the proposed method results in the most accurate CSMs, it also demonstrates that the CSMs continue smoothly through internal signal voids.

Figure 10:
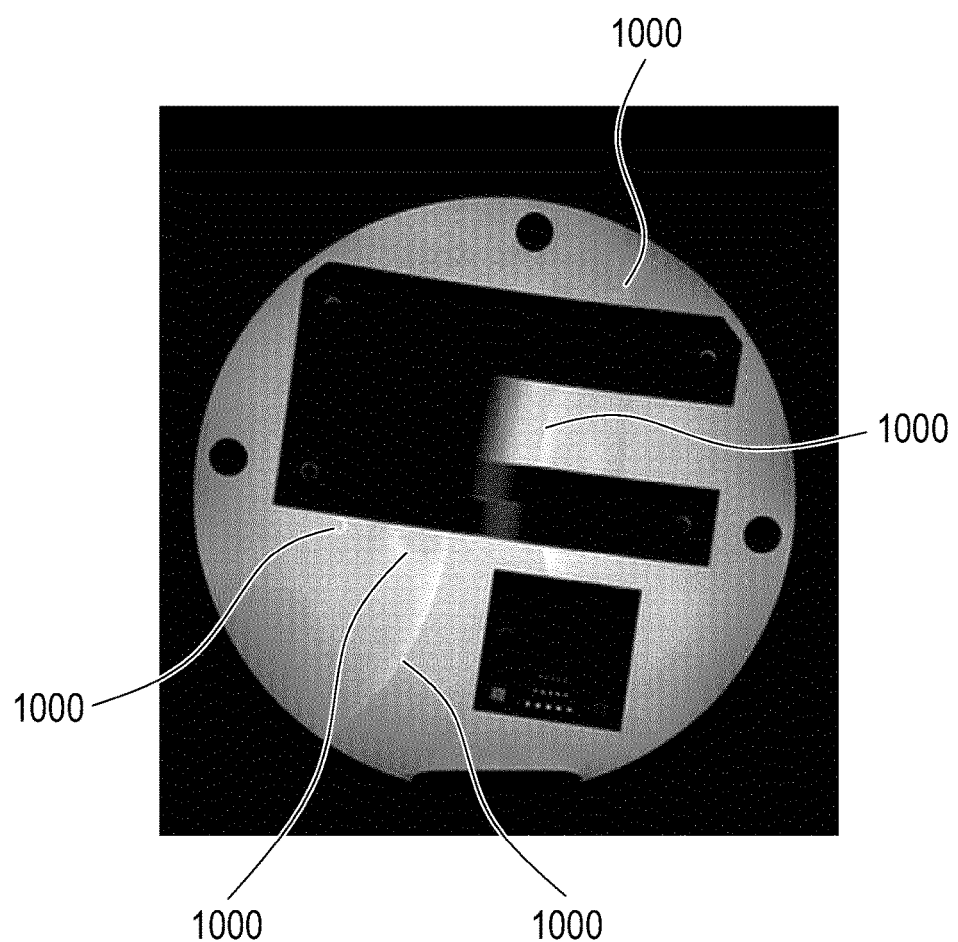
FIG. 10 shows a SENSE magnetic resonance image calculated using CSMs calculated using the traditional image division method.

FIG. 10 shows an example of a magnetic resonance image that was produced using the SENSE method using a 13 channel radio-frequency system with 13 multiple antenna elements. The Fig. shown in FIG. 10 was reproduced using these well-known method of calculating coil sensitivities using the division method of images. In this image there can be seen a large number of artifacts labeled 1000.

Figure 11:
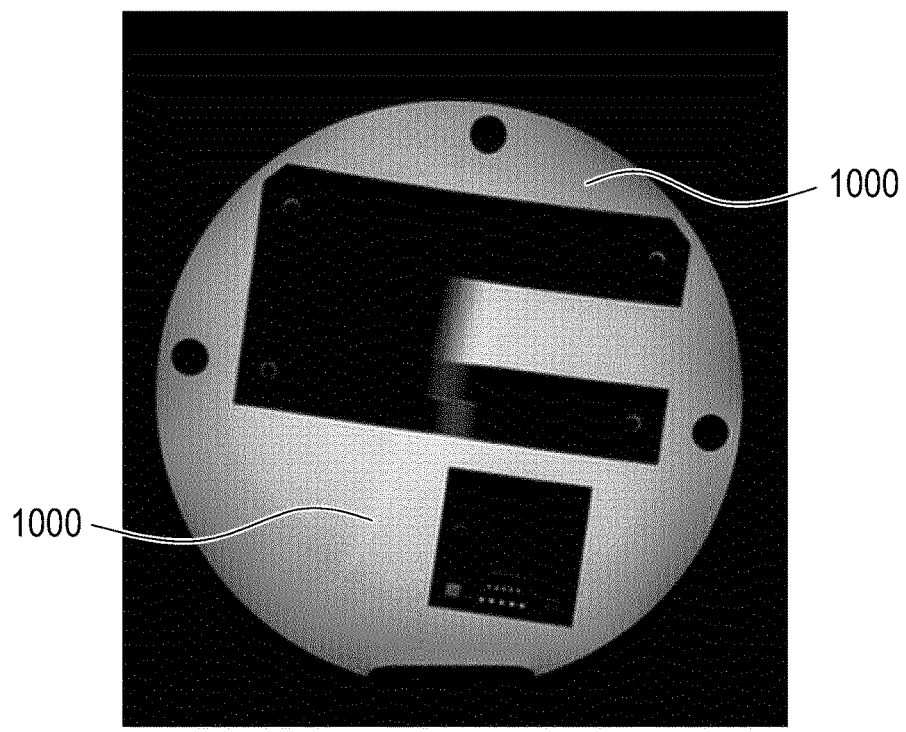
FIG. 11 shows the SENSE magnetic resonance image of FIG. 10 calculated using CSMs calculated using deconvolution.

FIG. 11 shows a magnetic resonance image calculated using the same data as was used in FIG. 10. However, the coil sensitivities were calculated differently. For FIG. 11 a kernel which is square and had a size of 7×7 in k-space was used. It can be seen a number of artifacts 1000 are still slightly visible in this Fig. However, the artifacts are less pronounced and not as easy to see in this image.

Figure 12:
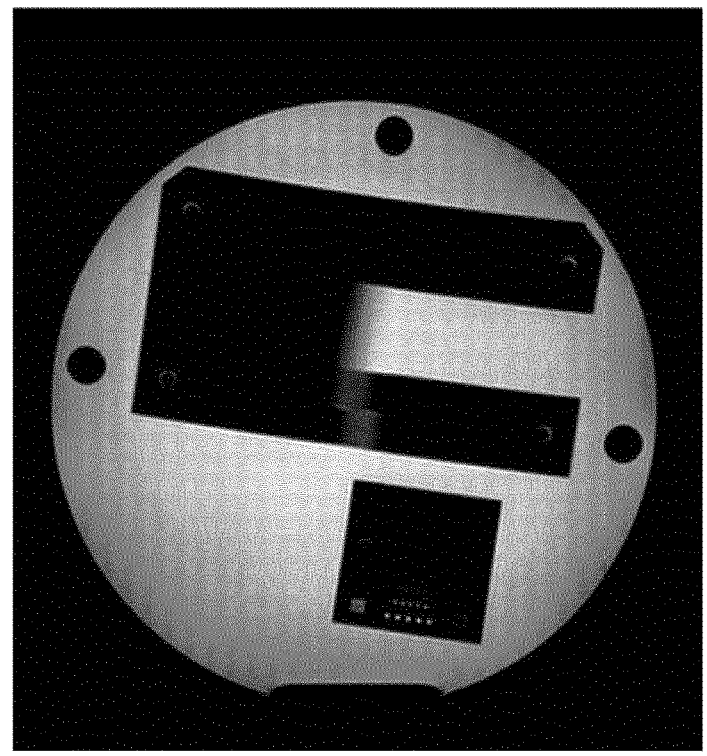
FIG. 12 shows the SENSE magnetic resonance image of FIG. 10 calculated using CSMs calculated using deconvolution and FOV extension.

FIG. 12 shows a magnetic resonance image calculated using the same data as for FIGS. 10 and 11. However, in this example a 15×15 kernel in k-space was used during the deconvolution. In this Fig. no image artifacts are visible. In both FIGS. 11 and 12 interpolation of the calibration magnetic resonance data was used for both. The difference is in the size of the kernel used for the deconvolution.

FIG. 13 shows two FIGS. 1300 and 1302. The images 1300, 1302 were reconstructed from the same data. However, different coil sensitivities were used. The magnetic resonance data for these two images 1300, 1302 was acquired using a compressed sensing magnetic resonance technique. In image 1300 the normal image division method of calculating the coil sensitivities was used. A number of artifacts 1304 are visible in this image. For image 1302 the calibration magnetic resonance data was interpolated to the modified magnetic resonance data and then a coil sensitivity kernel was calculated in order to calculate the coil sensitivities. In FIG. 1302 none of the artifacts 1300 are visible.

A way of representing the coil sensitivities matrix in k-space can be performed by using a discrete number of values on a grid where the magnetization is known. This uses only the low-frequency components and smoothes out small voids or holes in the object or its magnetization.

The k-space grid of the acquired data is not used because it enforces the periodicity of $c_i$ with the size of the field of view. Instead the field of view is extended before deconvolution is carried out. For example a factor of 2 larger may be used.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 200 first item
100 magnetic resonance imaging system
104 magnet
106 bore of magnet
108 imaging zone
110 magnetic field gradient coils
112 magnetic field gradient coil power supply
114 body coil
116 transceiver
118 subject
120 subject support
122 transceiver
124 magnetic resonance image coil
126 antenna element
130 computer
132 hardware interface
134 user interface
136 computer storage
138 computer memory
140 pulse sequences
142 calibration magnetic resonance data
144 modified magnetic resonance data
146 coil sensitivity kernels
148 set of coil sensitivities
150 first magnetic resonance image
152 modified magnetic resonance image
154 set of points in Fourier space
156 body coil magnetic resonance data
158 modified body coil magnetic resonance data
160 reference image
161 intermediate coil sensitivity kernel
162 intermediate coil sensitivity
164 imaging magnetic resonance data
166 diagnostic magnetic resonance image
170 control module
172 Image reconstruction and Fourier transform module
174 k-space interpolation module
700 1-D object
702 spatial coordinate
704 object magnetization
800 coil sensitivity
802 true coil sensitivity
804 coil sensitivity calculated using image division
806 coil sensitivity using deconvolution in Fourier space
808 coil sensitivity using FOV extension
900 coil sensitivity error
1000 artifact
1300 magnetic resonance image 1302 magnetic resonance image
1304 artifact

The invention claimed is:

1. A magnetic resonance imaging system, comprising:
a radio frequency system for acquiring magnetic resonance data of a subject within an imaging zone, wherein the radio frequency system comprises a coil with multiple antenna elements operable for acquiring the magnetic resonance data;
a non-transitory computer readable memory for storing machine readable instructions;
a processor for controlling the magnetic resonance imaging system, wherein execution of the machine readable instructions cause the processor to:
acquire calibration magnetic resonance data from a first field of view within the imaging zone using each of the multiple antenna elements;
calculate modified magnetic resonance data by interpolating the calibration magnetic resonance data to a second field of view within the imaging zone, wherein the second field of view encompasses and is larger than the first field of view;
calculate a coil sensitivity kernel for each of the multiple antenna elements by deconvolving the modified magnetic resonance data for each of the multiple antenna elements; and
calculate a coil sensitivity for each of the multiple antenna elements by transforming each coil sensitivity kernel into image space.

2. The magnetic resonance imaging system of claim 1, wherein the modified magnetic resonance data is calculated by:
reconstructing a first magnetic resonance image for each antenna element using the calibration magnetic resonance data;
calculating a modified magnetic resonance image for each antenna element, wherein each modified magnetic resonance image is defined by the second field of view and is calculated by pasting the first magnetic resonance image into a null valued image; and
calculating the modified magnetic resonance data by Fourier transforming the modified magnetic resonance image.

3. The magnetic resonance imaging system of claim 1, wherein the modified magnetic resonance data is calculated by interpolating the calibration magnetic resonance data for each of the multiple antenna elements to a predefined set of points in Fourier space, wherein the predefined set of points in Fourier space represent the second field of view.

4. The magnetic resonance imaging system of claim 3, wherein the modified magnetic resonance data for each of the antenna elements comprises a first set of points in Fourier space, and wherein the predefined set of points in Fourier space comprises the first set of points in Fourier space.

5. The magnetic resonance imaging system of claim 4, wherein execution of the instructions further cause the processor to generate the predetermined set of points in Fourier space by translating a unit cell.

6. The magnetic resonance imaging system of claim 1, wherein the radio frequency system further comprises a body coil; wherein execution of the instructions further causes the processor to:
acquire body coil magnetic resonance data from the first field of view using the body coil during acquisition of the calibration magnetic resonance data, and
calculate modified body coil magnetic resonance data by interpolating the body coil magnetic resonance data to the second field of view; and
wherein the coil sensitivity kernel for each of the multiple antenna elements is deconvolved with respect to the modified body coil magnetic resonance data.

7. The magnetic resonance imaging system of claim 1, wherein execution of the instructions cause the processor to deconvolve the coil sensitivity kernel for each of the multiple antenna elements by initially setting a reference image to a predetermined value; wherein execution of the instructions cause the processor to further deconvolve the coil sensitivity kernel for each of the multiple antenna elements by iteratively repeating the following steps:
calculate an intermediate coil sensitivity kernel by deconvolving the modified magnetic resonance data for each of the multiple antenna elements with respect to a Fourier transform of the reference image,
calculate an intermediate coil sensitivity for each of the multiple antenna elements by transforming each intermediate coil sensitivity kernel into image space, and
recalculate the reference image using the intermediate coil sensitivities and the calibration magnetic resonance data; and
wherein the iterative steps are repeated a predetermined number of time or when the reference image has converged within a predetermined statistical measure.

8. The magnetic resonance imaging system of claim 7, wherein the predetermined value of the reference image is a uniform value.

9. The magnetic resonance imaging system of claim 1, wherein the memory further contains pulse sequence data descriptive of a parallel imaging magnetic resonance technique, wherein execution of the instructions further cause the processor to:
acquire imaging magnetic resonance data using the pulse sequence data to control the magnetic resonance imaging system from the first field of view; and
reconstruct a magnetic resonance image using the imaging magnetic resonance data and the corrected coil sensitivity for each of the multiple antenna elements.

10. The magnetic resonance imaging system of claim 1, wherein execution of the instructions further cause the processor to recalculate the coil sensitivity for each of the multiple antenna elements by reducing the coil sensitivity to the first field of view.

11. A method of operating a magnetic resonance imaging system, wherein the magnetic resonance imaging system comprises a radio frequency for acquiring magnetic resonance data of a subject from an imaging zone, wherein the radio frequency system comprises a coil with multiple antenna elements operable for acquiring the magnetic resonance data, wherein the method comprises the steps of:
acquiring calibration magnetic resonance data from a first field of view within the imaging zone using each of the multiple antenna elements;
calculating modified magnetic resonance data by interpolating the calibration magnetic resonance data to a second field of view within the imaging zone, wherein the second field of view encompasses and is larger than the first field of view;
calculating a coil sensitivity kernel by deconvolving the modified magnetic resonance data for each of the multiple antenna elements;
calculating a coil sensitivity for each of the multiple antenna elements by transforming each coil sensitivity kernel into image space;

acquiring imaging magnetic resonance data from the first field of view using a parallel imaging technique;

reconstructing the acquired imaging magnetic resonance data into a magnetic resonance image using the calculated coil sensitivity for each of the multiple antenna elements; and controlling a display device to display the reconstructed magnetic resonance image.

12. The method of claim 11, wherein the modified magnetic resonance data is calculated by:

reconstructing a first calibration magnetic resonance image for each antenna element using the calibration magnetic resonance data;

calculating a modified calibration magnetic resonance image for each antenna element, wherein each modified calibration magnetic resonance image is defined by the second field of view and is calculated by pasting the first calibration magnetic resonance image into a null valued image; and calculating the modified magnetic resonance data by Fourier transforming the modified calibration magnetic resonance image.

13. A non-transitory computer-readable medium carrying machine readable instructions for a processor for controlling a magnetic resonance imaging system, wherein the magnetic resonance imaging system includes a radio frequency system for acquiring magnetic resonance data of a subject from an imaging zone, wherein the radio frequency system comprises a coil with multiple antenna elements operable for acquiring the magnetic resonance data, wherein execution of the instructions causes the processor to:

acquire calibration magnetic resonance data from a first field of view within the imaging zone using each of the multiple antenna elements;

calculate modified magnetic resonance data by interpolating the calibration magnetic resonance data to a second field of view within the imaging zone, wherein the second field of view encompasses and is larger than the first field of view;

calculate a coil sensitivity kernel by deconvolving the modified magnetic resonance data for each of the multiple antenna elements; and calculate a coil sensitivity for each of the multiple antenna elements by transforming each coil sensitivity matrix kernel into image space.

14. The non-transitory computer-readable medium of claim 13, wherein the modified magnetic resonance data is calculated by:

reconstructing a first magnetic resonance image for each antenna element using the calibration magnetic resonance data;

calculating a modified magnetic resonance image for each antenna element, wherein each modified magnetic resonance image is defined by the second field of view and is calculated by pasting the first magnetic resonance image into a null valued image; and calculating the modified magnetic resonance data by Fourier transforming the modified magnetic resonance image.

15. The non-transitory computer-readable medium of claim 13, wherein the modified magnetic resonance data is calculated by interpolating the calibration magnetic resonance data for each of the multiple antenna elements to a predefined set of points in Fourier space, wherein the predefined set of points in Fourier space represent the second field of view.

16. The non-transitory computer-readable medium of claim 13, wherein the instructions further control the processor to:

acquire imaging magnetic resonance data from the first field of view using a parallel imaging technique;

reconstruct the acquired imaging magnetic resonance data into a magnetic resonance image using the calculated coil sensitivity for each of the multiple antenna elements; and control a display device to display the reconstructed magnetic resonance image.

17. A magnetic resonance imaging system comprising:

a radio frequency coil with multiple antenna elements, each antenna element being configured to acquire magnetic resonance data from a subject within an imaging zone;

one or more processors configured to:

receive calibration magnetic resonance data from a first field of view within the imaging zone using each of the multiple antenna elements, calculate modified calibration magnetic resonance data by interpolating the calibration magnetic resonance data to a second field of view within the imaging zone, wherein the second field of view encompasses and is larger than the first field of view, calculate a coil sensitivity kernel for each of the multiple antenna elements by deconvolving the modified magnetic resonance data, calculate a coil sensitivity for each of the multiple antenna elements by transforming each coil sensitivity kernel into image space, receive imaging magnetic resonance data generated using a parallel imaging technique from the first field of view, reconstruct the acquired imaging magnetic resonance data into a magnetic resonance image using the calculated coil sensitivity for each of the multiple antenna elements, and control a display device to display the reconstructed magnetic resonance image.

* * * * *